United States Patent
Wright et al.

(10) Patent No.: US 12,094,681 B2
(45) Date of Patent: Sep. 17, 2024

(54) HYBRID ION SOURCE FOR ALUMINUM ION GENERATION USING A TARGET HOLDER AND A SOLID TARGET

(71) Applicant: Applied Materials, Inc., Santa Clara, CA (US)

(72) Inventors: Graham Wright, Newburyport, MA (US); Shardul S. Patel, Chelmsford, MA (US)

(73) Assignee: Applied Materials, Inc., Santa Clara, CA (US)

( * ) Notice: Subject to any disclaimer, the term of this patent is extended or adjusted under 35 U.S.C. 154(b) by 333 days.

(21) Appl. No.: 17/740,861

(22) Filed: May 10, 2022

(65) Prior Publication Data
US 2023/0369008 A1 Nov. 16, 2023

(51) Int. Cl.
*H01J 37/08* (2006.01)
*H01J 37/32* (2006.01)
*H01J 37/34* (2006.01)

(52) U.S. Cl.
CPC ........ *H01J 37/08* (2013.01); *H01J 37/32055* (2013.01); *H01J 37/32064* (2013.01);
(Continued)

(58) Field of Classification Search
CPC ............... H01J 37/32064; H01J 37/08; H01J 37/32055; H01J 37/3244; H01J 37/342;
(Continued)

(56) References Cited

U.S. PATENT DOCUMENTS 8,759,788 B1 6/2014 Bassom
10,600,611 B2 3/2020 Becker et al.
(Continued)

FOREIGN PATENT DOCUMENTS

CN 102844842 A 12/2012
JP 2019-139943 A 8/2019
(Continued)

OTHER PUBLICATIONS

Notice of Allowance mailed Apr. 29, 2024 in co-pending U.S. Appl. No. 17/740,854.
(Continued)

*Primary Examiner* — Kiet T Nguyen
(74) *Attorney, Agent, or Firm* — NIELDS, LEMACK & FRAME, LLC

(57) ABSTRACT

An ion source that is capable of different modes of operation is disclosed. The ion source includes an insertable target holder includes a hollow interior into which the solid dopant material is disposed. The target holder may a porous surface at a first end, through which vapors from the solid dopant material may enter the arc chamber. The porous surface inhibits the passage of liquid or molten dopant material into the arc chamber. The target holder is also constructed such that it may be refilled with dopant material when the dopant material within the hollow interior has been consumed. A solid target is also disposed in the arc chamber. When the insertable target holder is used, multicharged ions are created. When the insertable target holder is retracted, single charged ions are created by only etching the solid dopant-containing compound.

19 Claims, 9 Drawing Sheets

(52) U.S. Cl.
CPC ........ *H01J 37/3244* (2013.01); *H01J 37/342* (2013.01); *H01J 37/3426* (2013.01); *H01J 2237/08* (2013.01)

(58) Field of Classification Search
CPC ... H01J 37/3426; H01J 2237/08; H01J 27/205
USPC .......................................................... 250/426
See application file for complete search history.

(56) References Cited

U.S. PATENT DOCUMENTS

| | | |
|---|---|---|
| 10,957,509 B1 | 3/2021 | Wright et al. |
| 11,170,973 B2 | 11/2021 | Patel et al. |
| 11,404,254 B2 | 8/2022 | Patel et al. |
| 11,664,192 B2 * | 5/2023 | Patel ................ H01J 37/08 315/326 |
| 11,854,760 B2 * | 12/2023 | Wright ................ H01J 27/14 |
| 2004/0187782 A1 | 9/2004 | McLeod et al. |
| 2006/0169915 A1 | 8/2006 | Olson et al. |
| 2008/0142702 A1 | 6/2008 | Frosien et al. |
| 2010/0025576 A1 | 2/2010 | Adams |
| 2010/0108902 A1 | 5/2010 | Frosien et al. |
| 2010/0320395 A1 | 12/2010 | Hahto et al. |
| 2011/0260047 A1 | 10/2011 | Lee |
| 2012/0235058 A1 | 9/2012 | Sinha et al. |
| 2012/0252195 A1 | 10/2012 | Jones et al. |
| 2013/0140473 A1 | 6/2013 | Colvin et al. |
| 2014/0110598 A1 | 4/2014 | Wu et al. |
| 2014/0151572 A1 | 6/2014 | Lin et al. |
| 2015/0008332 A1 | 1/2015 | Notte, IV et al. |
| 2015/0034837 A1 | 2/2015 | Koo et al. |
| 2015/0270111 A1 | 9/2015 | Wood |
| 2019/0180971 A1 | 6/2019 | Becker et al. |
| 2020/0090916 A1 | 3/2020 | Patel et al. |
| 2020/0303154 A1 | 9/2020 | Bassom et al. |
| 2020/0388468 A1 | 12/2020 | Sporleder et al. |
| 2021/0110995 A1 * | 4/2021 | Patel ................ H01J 37/302 |
| 2021/0375585 A1 | 12/2021 | Patel et al. |
| 2022/0139664 A1 | 5/2022 | Colvin et al. |
| 2023/0369006 A1 | 11/2023 | Wright et al. |
| 2023/0369007 A1 | 11/2023 | Wright et al. |
| 2023/0395357 A1 | 12/2023 | Wright et al. |

FOREIGN PATENT DOCUMENTS

| | | |
|---|---|---|
| TW | 201234400 A | 8/2012 |
| TW | 201604915 A | 2/2016 |
| WO | 2021/045873 A1 | 3/2021 |

OTHER PUBLICATIONS

International Search Report and Written Opinion mailed Aug. 2, 2023 in corresponding PCT application No. PCT/US2023/018516.
International Search Report and Written Opinion mailed Aug. 28, 2023 in co-pending PCT application No. PCT/US2023/021102.
International Search Report and Written Opinion mailed Jan. 4, 2024 in co-pending PCT application No. PCT/US2023/018513.
International Search Report and Written Opinion mailed Aug. 1, 2023 in co-pending PCT application No. PCT/US2023/018511.
Office Action mailed Dec. 22, 2023 in co-pending U.S. Appl. No. 17/740,854.

* cited by examiner

US 12,094,681 B2

HYBRID ION SOURCE FOR ALUMINUM ION GENERATION USING A TARGET HOLDER AND A SOLID TARGET

FIELD

Embodiments of the present disclosure relate to an ion source and more particularly, an ion source having multiple modes to generate ions of a species having different charges.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to create ions that have a single charge. However, in other embodiments, it may be desirable to create ions that are multicharged. Unfortunately, for certain materials, such as aluminum and other metals, the mechanisms that are used to create singly charged ions may not be effective in creating multicharged ions. Therefore, different ion sources may be utilized depending on the desired charge of the extracted ions.

This solution is expensive as it utilizes several ion sources. Further, this solution is time consuming, as it takes time to switch from one ion source to a different ion source.

Therefore, a single ion source that is capable of operating in different modes in order to generate ions having different charges would be beneficial. Additionally, it would be advantageous if the arc chamber could be changed from one mode to another quickly.

SUMMARY

An ion source that is capable of different modes of operation is disclosed. The ion source includes an insertable target holder includes a hollow interior into which the solid dopant material is disposed. The target holder may a porous surface at a first end, through which vapors from the solid dopant material may enter the arc chamber. The porous surface inhibits the passage of liquid or molten dopant material into the arc chamber. The target holder is also constructed such that it may be refilled with dopant material when the dopant material within the hollow interior has been consumed. A solid target comprising a compound containing the dopant of interest is also disposed in the arc chamber. When the insertable target holder is used, multicharged ions are created. When the insertable target holder is retracted, single charged ions are created by only etching the solid dopant-containing compound.

BRIEF DESCRIPTION OF THE FIGURES

For a better understanding of the present disclosure, reference is made to the accompanying drawings, which are incorporated herein by reference and in which.

DETAILED DESCRIPTION

As noted above, certain dopants, such as aluminum and other metals, utilize different mechanisms to create singly charged ions and multicharged ions.

Figure 1:
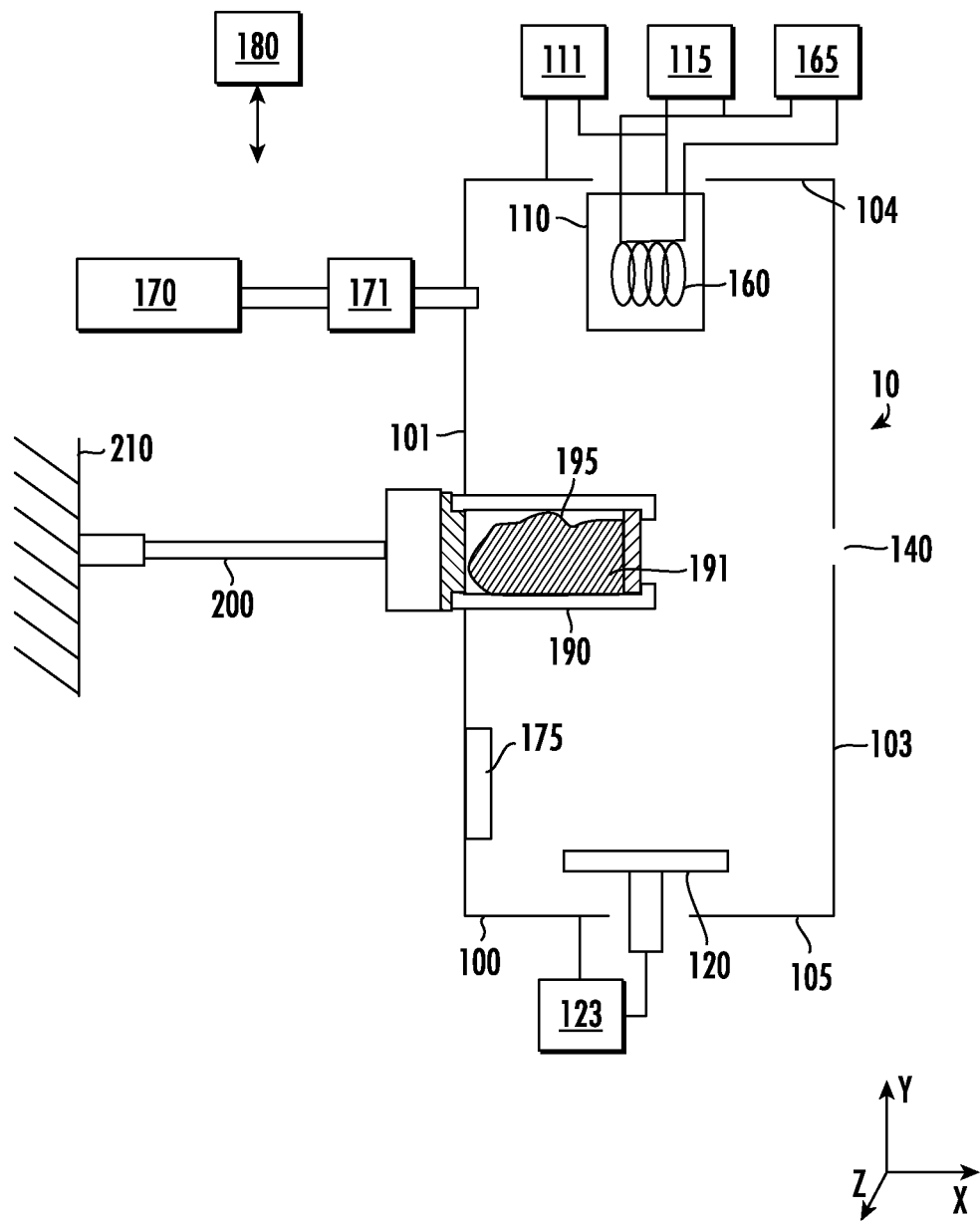
FIG. 1 is an indirectly heated cathode (IHC) ion source having several modes of operation in accordance with one embodiment.

FIG. 1 shows an IHC ion source 10 with an insertable target holder that overcomes these issues. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page).

Further, the IHC ion source 10 may be in communication with a gas source. The gas source 170 may contain a gas, which may be a halogen containing species. In some embodiments, the gas may be a fluorine containing species, such as $PF_3$ or $NF_3$. A valve 171 may be utilized to control the flow of the gas from the gas source 170 to the ion source 10. The valve 171 may be a mass flow controller (MFC) such that the flow rate may be controlled.

Figure 9:
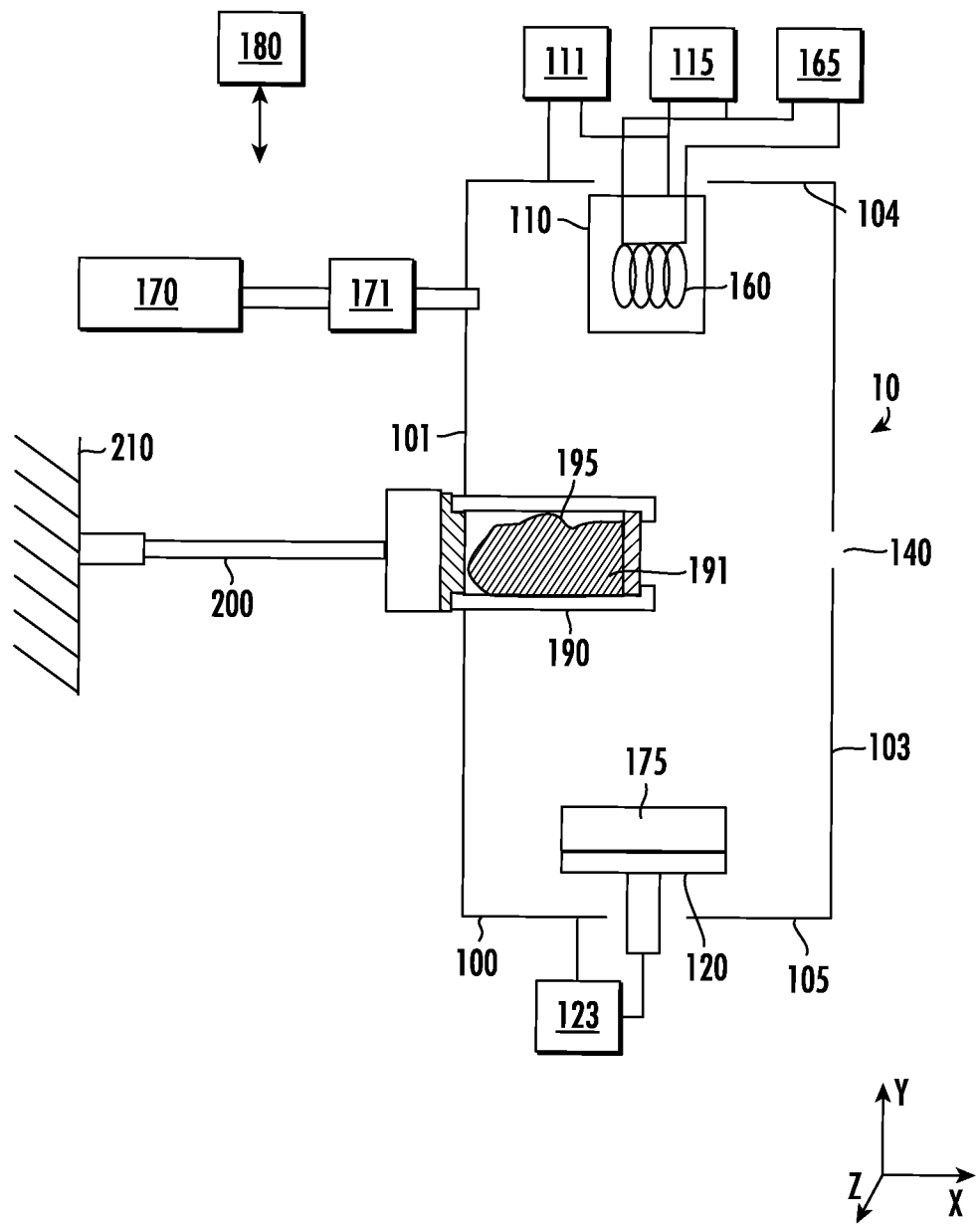
FIG. 9 is an indirectly heated cathode (IHC) ion source having several modes of operation in accordance with another embodiment.

A solid target 175 may be disposed within the arc chamber 100. In FIG. 1, the solid target is shown disposed against the wall that is opposite the extraction plate 103. However, other embodiments are possible. For example, the solid target 175 may be disposed on a wall that is adjacent to the extraction plate 103. Further, in another embodiment, shown in FIG. 9, the solid target 175 may be disposed on the second end 105. In this embodiment, the solid target 175 may be disposed on the repeller 120. Alternatively, the solid target 175 may replace the repeller 120. The solid target 175 is a compound that comprises the dopant of interest. For example, the solid target 175 may be a ceramic material that contains a metal. For example, in one embodiment, the metal may be aluminum and the solid target 175 may be aluminum oxide ($Al_2O_3$) or aluminum nitride (AlN).

The IHC ion source 10 also includes a target holder 190, which can be inserted into and retracted from the arc chamber 100. In the embodiment of FIG. 1, the target holder 190 is in the extended position where it is within the arc chamber 100. In this figure, the target holder 190 enters the arc chamber along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 1, the target holder 190 enters the arc chamber 100 through the side opposite the extraction aperture 140. However, in other embodiments, the target holder 190 may enter through the sides that are adjacent to the extraction plate 103. In yet another embodiment, the target holder may enter through the second end 105.

The target holder 190 may include a hollow interior 191 into which the dopant material 195 may be disposed. The hollow interior 191 may be defined as the interior of a hollow cylindrical crucible.

A dopant material 195, which is a metal such as indium, aluminum, antimony or gallium, may be disposed within the hollow interior 191 of the target holder 190. In certain embodiments, the dopant material 195 may be a pure metal, where "pure" denotes a metal having a purity of at least 99%. The dopant material 195 may be in the form of a solid when placed in the hollow interior 191. This may be in the form of a block of material, filings, shavings, balls, or other shapes. In certain embodiments, the dopant material 195 may melt and become a liquid. The metal that is used for the dopant material 195 is the same metal that is in the ceramic material used for the solid target 175. For example, the dopant material 195 may be aluminum while the solid target may be aluminum oxide or aluminum nitride.

The target holder 190 is in communication with one end of an actuator 200. The opposite end of the actuator 200 may be in communication with a support 210. In certain embodiments, this support 210 may be the housing of the IHC ion source 10. In certain embodiments, the actuator 200 may be able to change its total displacement. For example, the actuator 200 may be a telescoping design.

Figure 2:
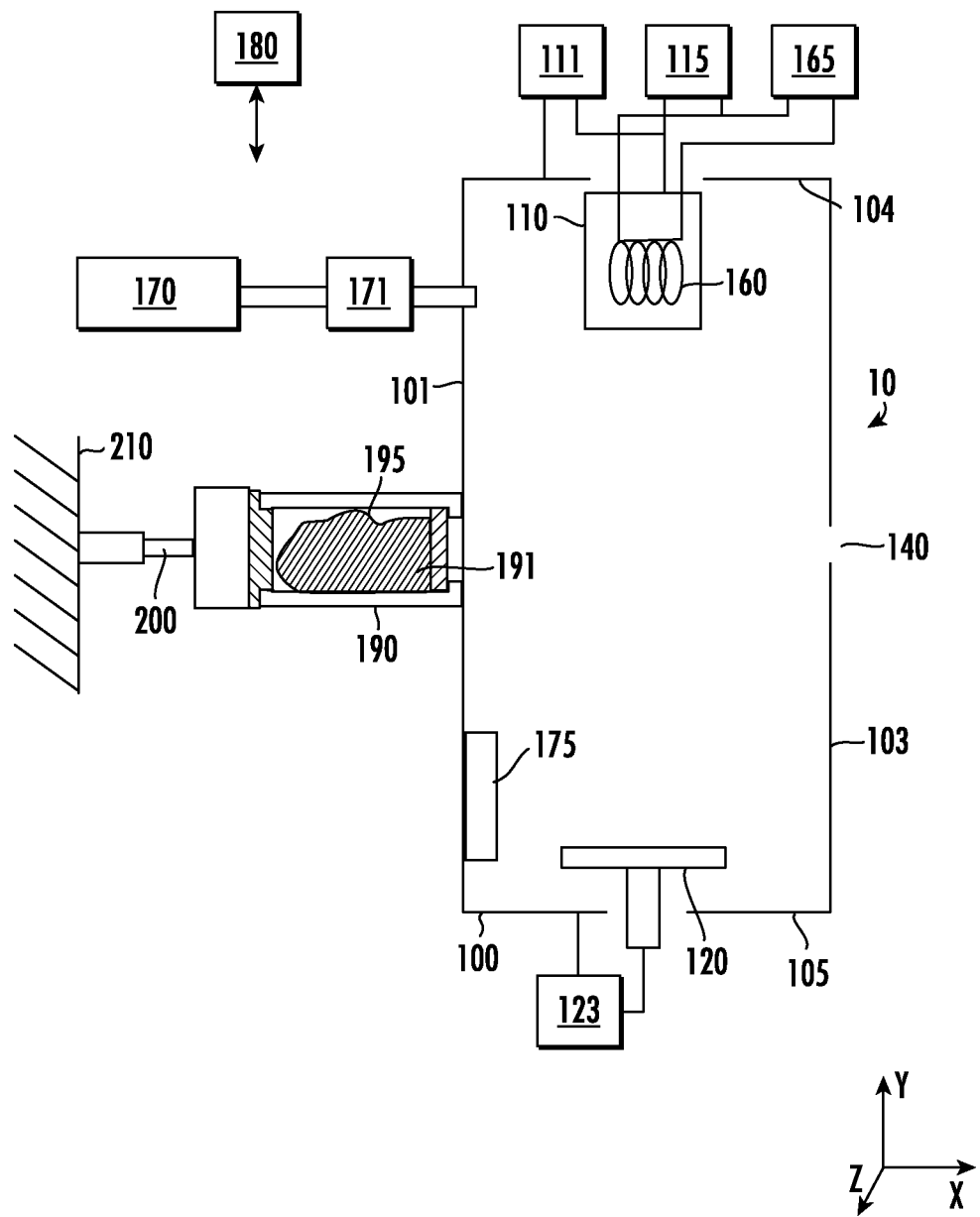
FIG. 2 is the IHC ion source of FIG. 1 with the insertable target holder retracted.

FIG. 2 shows the IHC ion source 10 with the actuator 200 in the retracted position. In this position, the hollow interior 191 is completely outside the arc chamber 100. In certain embodiments, the dopant material 195 cools when the target holder 190 is outside the arc chamber 100. In this way, none of the dopant material 195 enters the arc chamber when the actuator 200 is in the retracted position.

While FIG. 1 shows the hollow interior 191 completely within the arc chamber 100 and FIG. 2 shows the hollow interior 191 completely outside the arc chamber 100, other positions may be possible. By controlling the distance that the target holder 190 is inserted into the arc chamber 100, the temperature of the target holder 190 and the dopant material 195 may be controlled.

A controller 180 may be in communication with one or more of the power supplies such that the voltage or current supplied by these power supplies may be modified. The controller 180 may also be in communication with the actuator 200 and the valve 171. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The controller 180 is configured to allow the ion source 10 to operate in a plurality of different modes. These modes include a single charge operating mode; and a multicharged operating mode. Each of these modes will be described in more detail.

In the single charge mode, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet that is in communication with the valve 171.

The controller 180 opens the valve 171 so as to allow the flow of the gas into the arc chamber 100. The controller 180 also controls the actuator 200 so that it is removed from the arc chamber 100, as shown in FIG. 2.

In this way, the gas is introduced into the arc chamber 100 via the valve 171. The gas is a halogen containing gas, which is useful in that it can effectively etch the solid target 175 and also provide a halogen, such as fluorine, to recycle aluminum from the walls of the arc chamber 100. The combination of electrons from the cathode 110, the gas and the positive potential creates a plasma. This plasma serves to etch or sputter the solid target 175. The ions in this plasma may be mostly single charged ions, such as Al+. In certain embodiments, the electrons and positive ions may be somewhat confined by a magnetic field. In certain embodiments, the plasma is confined near the center of the arc chamber 100, proximate the extraction aperture 140.

Thus, when it is desired to create single charged ions, such as Al+, the operator may transmit this preference to the controller 180. Alternatively, the controller 180 may determine the desired mode based on the desired charge state and beam current. In response, the controller 180 may perform the sequence described above.

In multicharge mode, the controller 180 opens the valve 171 so as to allow the flow of the first gas into the arc chamber 100. The controller 180 also controls the actuator 200 so that it is inserted into the arc chamber 100, as shown in FIG. 1.

The gas is introduced into the arc chamber 100. As noted above, the gas may be a halogen containing gas, such as $PF_3$ or $NF_3$. These gasses are useful in that they effectively ionize the vapor from the dopant material 195 and also provide a halogen to recycle aluminum from the walls of the arc chamber 100. The combination of electrons from the cathode 110, the gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching, increased temperature or sputtering by the plasma transforms the dopant material 195 into the gas phase and causes ionization. Many of the ions that are created in the plasma may be multicharged ions, such as $Al^{++}$ or $Al^{+++}$. The ionized feed material can then be extracted through the extraction aperture 140 and used to prepare an ion beam.

Vapor, negative ions and neutral atoms that are sputtered or otherwise released from the dopant material 195 are attracted toward the plasma, since the plasma is maintained at a more positive voltage than the target holder 190.

Additionally, since the solid target 175 remains disposed in the arc chamber 100, it is etched by the gas and contributes ions to the plasma.

In certain embodiments, the dopant material 195 is heated and vaporized due to the heat created by the plasma. However, in other embodiments, the dopant material 195 may be heated by additional means as well. For example, a heating element may be disposed within the target holder 190 to further heat the dopant material 195. The heating element may be a resistive heating element, or some other type of heater.

In certain embodiments, the target holder 190 may be made of a conductive material and may be grounded. In a different embodiment, the target holder 190 may be made of a conductive material and may be electrically floated. In a different embodiment, the target holder 190 may be made of a conductive material and may be maintained at the same voltage as the walls 101 or the actuator 200. In other embodiments, the target holder 190 may be made of an insulating material.

In yet another embodiment, the target holder 190 may be biased electrically with respect to the arc chamber 100. For example, the target holder 190 may be made from a conductive material and may be biased by an independent power supply (not shown) so as to be at a different voltage than the walls 101. This voltage may be more positive or more negative than the voltage applied to the walls 101. In this way, electrical biasing may be used to sputter the dopant material 195 or as an additional means of heating the dopant material.

Thus, when it is desired to create multicharged ions, the operator may transmit this preference to the controller 180. Alternatively, the controller 180 may determine the desired mode based on the desired charge state and beam current. In response, the controller 180 may perform the sequence described above.

Figure 3:
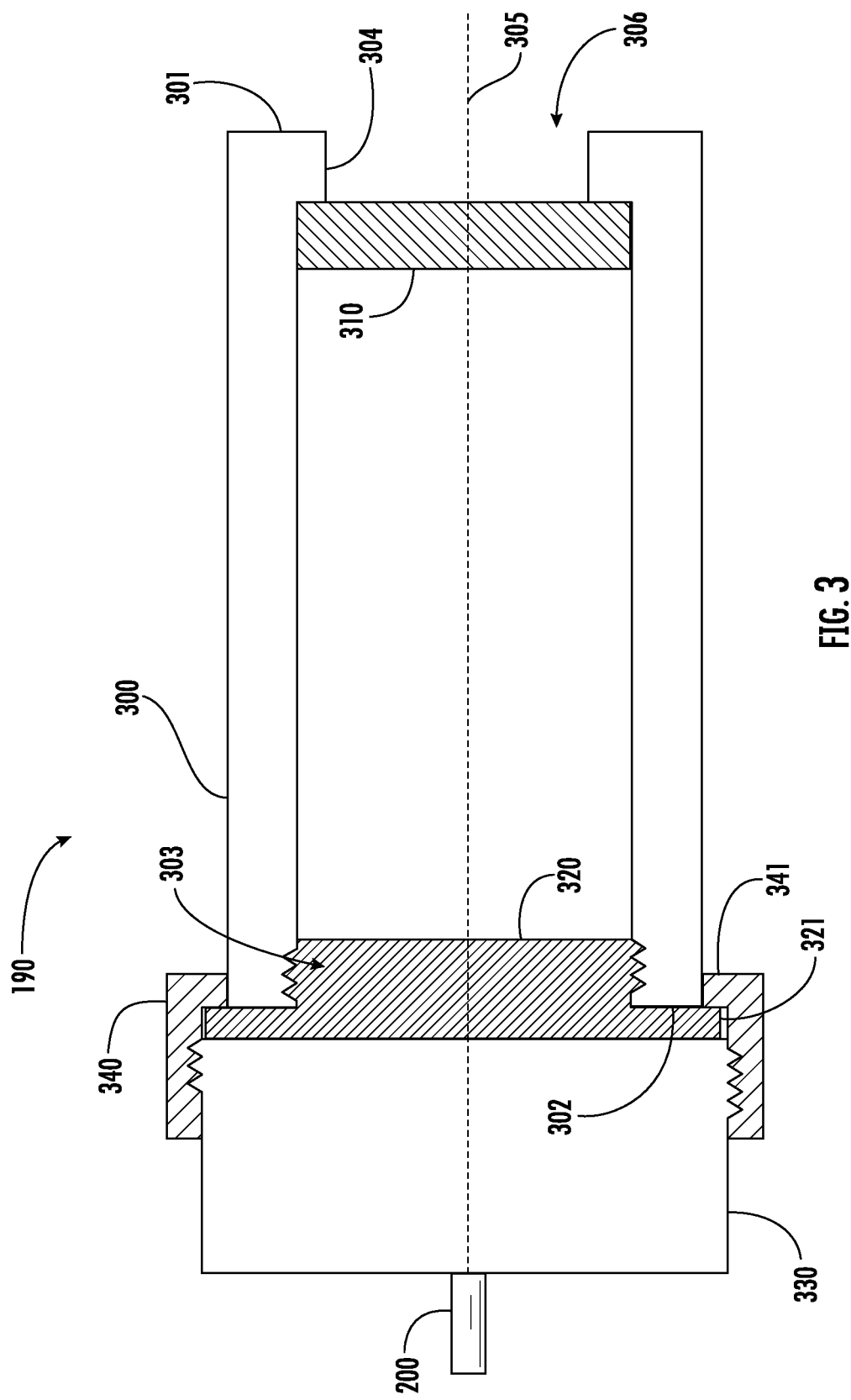
FIG. 3 shows the target holder according to one embodiment.

FIG. 3 shows one embodiment of the target holder 190 in greater detail. In this embodiment, the target holder 190 includes a crucible 300. The crucible 300 may be a hollow cylinder with an open face on a first end 301 and a hole 303 on the second end 302. The open face at the first end 301 may have a lip 304 that extends toward the central axis 305 of the cylinder. Thus, the opening 306 on the first end 301 may be smaller than the inner diameter of the hollow cylinder due to the lip 304. The diameter of the opening 306 may also be smaller than the diameter of the hole 303 on the second end 302. The crucible 300 may be constructed of graphite, a refractory material, aluminum oxide, a carbide or another suitable material.

A porous insert 310, which may be in the shape of a disc, is inserted into the interior of the crucible 300 through the hole 303 on the second end 302. The outer diameter of the porous insert 310 may be approximately the same as the inner diameter of the crucible 300 and is larger than the diameter of the opening 306. In certain embodiments, the inner diameter of the crucible 300 may be slightly smaller than the outer diameter of the porous insert 310 to create an interference fit. In some embodiments, the outer diameter of the porous insert 310 may be 0.1 inches larger than the diameter of the opening 306. Thus, once inserted, the porous insert 310 is held in place by the lip 304 so that it cannot be removed or fall through the opening 306. The porous insert 310 may be graphite foam, a graphite or refractory mesh, silicon carbide, alumina foam or another suitable material. The pore size and porosity may be selected to allow the passage of vapor while resisting the flow of liquid through the porous insert 310. It has been found that liquid metals, such as liquid aluminum, have very high surface tension. Thus, while vapor from the melted aluminum is able to pass through the porous insert 310, the liquid material does not due to the surface tension.

An end plug 320 is installed on the second end 302 of the crucible 300. In certain embodiments, the hole 303 may be a tapped hole and the end plug 320 may be threaded, such that the end plug 320 is screwed into the second end 302 of the crucible 300. The end plug 320 may be constructed of graphite or another suitable material. The end plug 320 serves to prevent liquid material from exiting through the hole 303 and allows refilling of the crucible 300.

The target holder 190 may also include a target base 330. The target base 330 may be affixed to the actuator 200. The target base 330 is attached to the crucible by means of a retaining fastener 340. For example, in one embodiment, a portion of the end plug 320 has a larger diameter than the outer diameter of the crucible 300. In this way, when the end plug 320 is screwed into the second end 302 of the crucible, a portion of the end plug 320 extends further outward from the central axis than the crucible 300, creating protrusion 321.

In another embodiment, the crucible 300 has a protrusion along its outer diameter, proximate the second end 302.

A retaining fastener 340 may be used to secure the crucible 300 to the target base 330. The retaining fastener 340 may be ring shaped and be threaded on its inner surface. Further, the retaining fastener 340 has a lip 341, which has a smaller diameter than the protrusion 321. Thus, the retaining fastener 340 can then be installed over the first end 301 of the crucible 300. The retaining fastener 340 may be screwed onto the target base 330, which may be threaded on its outer surface. The rotation of the retaining fastener 340 continues until the lip 341 contacts the protrusion 321. This pressure affixes the crucible 300 to the target base 330.

In this embodiment, the dopant material 195 may be inserted into the target holder 190 as follows. First, the porous insert 310 is inserted into the hole 303 in the second end 302 of the crucible 300. The porous insert 310 is moved through the interior of the crucible 300 so that it presses against the lip 304. Next, the dopant material 195 may be disposed in the crucible 300 through the hole 303 in the second end 302. The presence of the porous insert 310 holds the dopant material 195 in the crucible and prevents it from passing through the opening 306. Once the dopant material 195 has been added, the crucible 300 may be closed by screwing the end plug 320 into the second end 302. The crucible assembly, which includes the crucible 300, the end plug 320 and the porous insert 310, is then positioned against the target base 330. A retaining fastener 340 is slid over the first end 301 of the crucible 300 and moved toward the second end 302, where it is screwed onto the target base 330. The target holder 190 is now ready for use.

Thus, in this embodiment, the first end 301 of the crucible 300 comprises an open face, where the porous insert 310 is disposed proximate the open face. This porous insert 310 serves as a porous surface through which vapors may pass from the hollow interior to the arc chamber. The second end 302 comprises a hole 303 such that an end plug 320 can be removably attached to the crucible 300. For example, the end plug 320 may be screwed into a tapped hole at the second end 302. In this way, the dopant material 195 can be replenished after the material within the target holder 190 has been consumed. In other words, the crucible 300 may be replenished by removing the crucible assembly from the target base 330 by unscrewing the retaining fastener 340. Once this is done, the end plug 320 may be unscrewed from the crucible 300. Additional dopant material 195 can then be deposited in the crucible 300.

Figure 4:
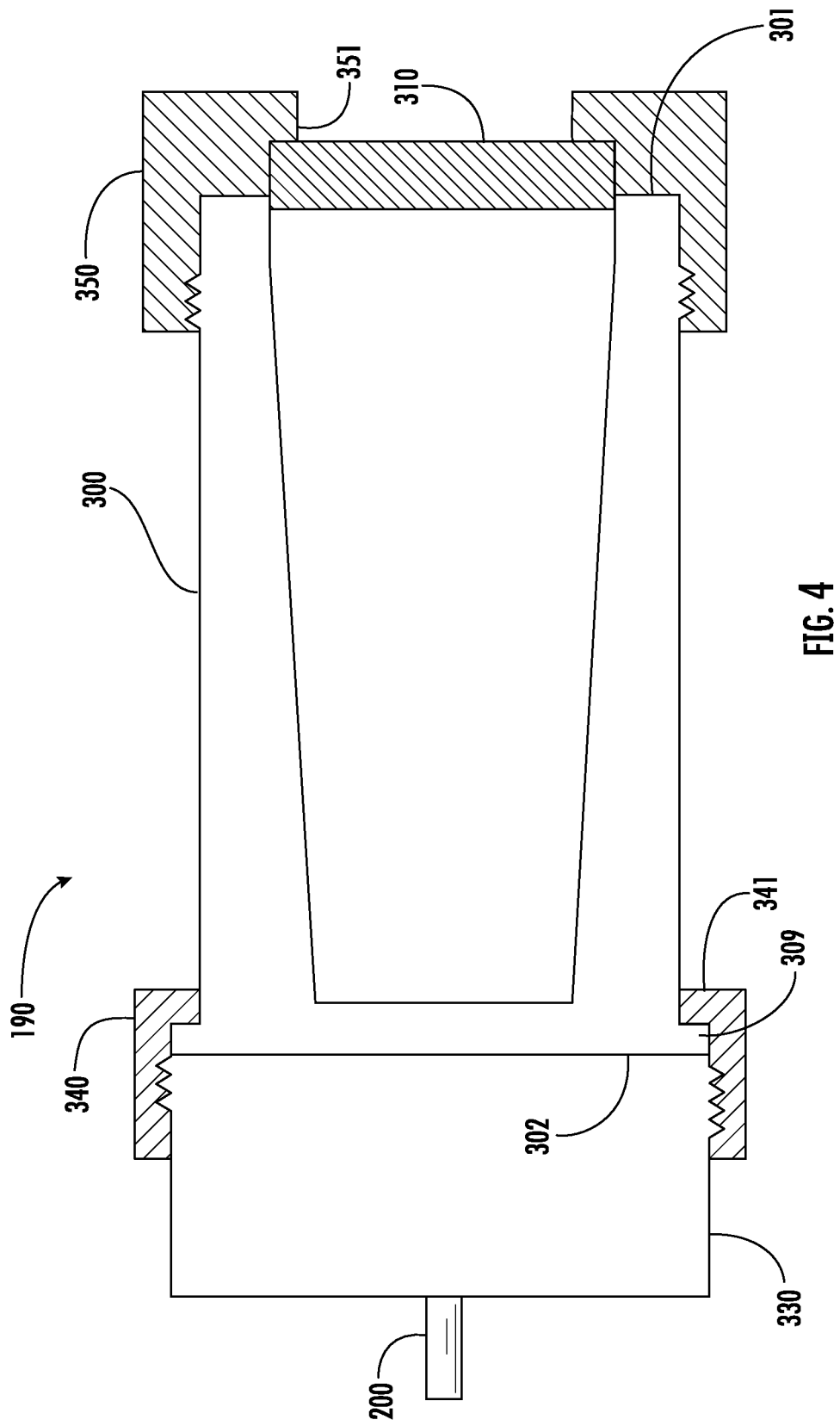
FIG. 4 shows the target holder according to another embodiment.

FIG. 4 shows the target holder 190 according to another embodiment. In this embodiment, the second end 302 of the crucible is closed, such that only the first end 301 is open. The crucible 300 has a protrusion 309 proximate the second end 302. This protrusion 309 is used by the retaining fastener 340 to affix the crucible 300 to the target base 330. As described above, the retaining fastener 340 may screw onto the target base 330.

In this embodiment, a retention cap 350 is disposed proximate the first end 301 of the crucible 300. The retention cap 350 is ring shaped having an open face with a lip 351 on its front face, protruding toward the center of the ring. The inner surface of the retention cap 350 may be threaded. Further, in this embodiment, the outer surface of the crucible 300 near the first end 301 may also be threaded. In this way, the retention cap 350 may be screwed onto the first end 301 of the crucible 300.

The porous insert 310 is inserted through the opening in the first end 301. For example, the diameter of the porous insert 310 may be roughly the same size as the inner diameter of the crucible 300, but may be greater than the inner diameter of the open face of the retention cap 350 near the lip 351. In certain embodiments, the inner diameter of the crucible 300 may be slightly smaller than the outer diameter of the porous insert 310 to create an interference fit. In some embodiments, the outer diameter of the porous insert 310 may be 0.1 inches larger than the inner diameter of the open face.

Thus, in this embodiment, the first end 301 is both the location where the porous insert 310 is located and where the solid dopant material is added to the crucible 300. Specifically, in this embodiment, the dopant material 195 may be inserted into the target holder 190 as follows. First, the dopant material 195 may be deposited in the crucible 300 through the first end 301. Once the dopant material 195 has been added, the crucible may be closed by positioning the porous insert 310 near the opening on the first end 301. The retention cap 350 is then screwed onto the first end of the crucible 300, holding the porous insert 310 in place. The crucible assembly, which includes the crucible 300, the retention cap 350 and the porous insert 310, is then positioned against the target base 330. A retaining fastener 340 is inserted over the first end 301 of the crucible 300 and slid toward the second end 302, where it is screwed onto the target base 330. The target holder 190 is now ready for use.

By using a retention cap 350, the interior of the crucible can be accessed to replenish the dopant material 195 after the material within the target holder 190 has been consumed. In other words, the crucible 300 may be replenished by optionally removing the crucible assembly from the target base 330 by unscrewing the retaining fastener 340. Once this is done, the retention cap 350 may be unscrewed from the crucible 300. Additional dopant material 195 can then be deposited in the crucible 300.

Further, as shown in FIG. 4, the interior surfaces of the crucible 300 may be sloped or ramped such that the inner diameter of the crucible 300 near the first end 301 is larger than the inner diameter near the second end 302. This allows dopant material to flow toward the first end 301 of the crucible. This may serve to increase the temperature of the dopant material to enhance the creation of vapor near the porous insert 310.

The embodiments of FIGS. 3 and 4 utilize a porous insert 310 that passes vapors but does not pass liquid. In other words, the porous insert 310 serves as a porous surface that is disposed on the first end of the crucible and separates the hollow interior of the crucible 300 from the arc chamber 100. Other means may be used to create this porous surface.

Figure 5:
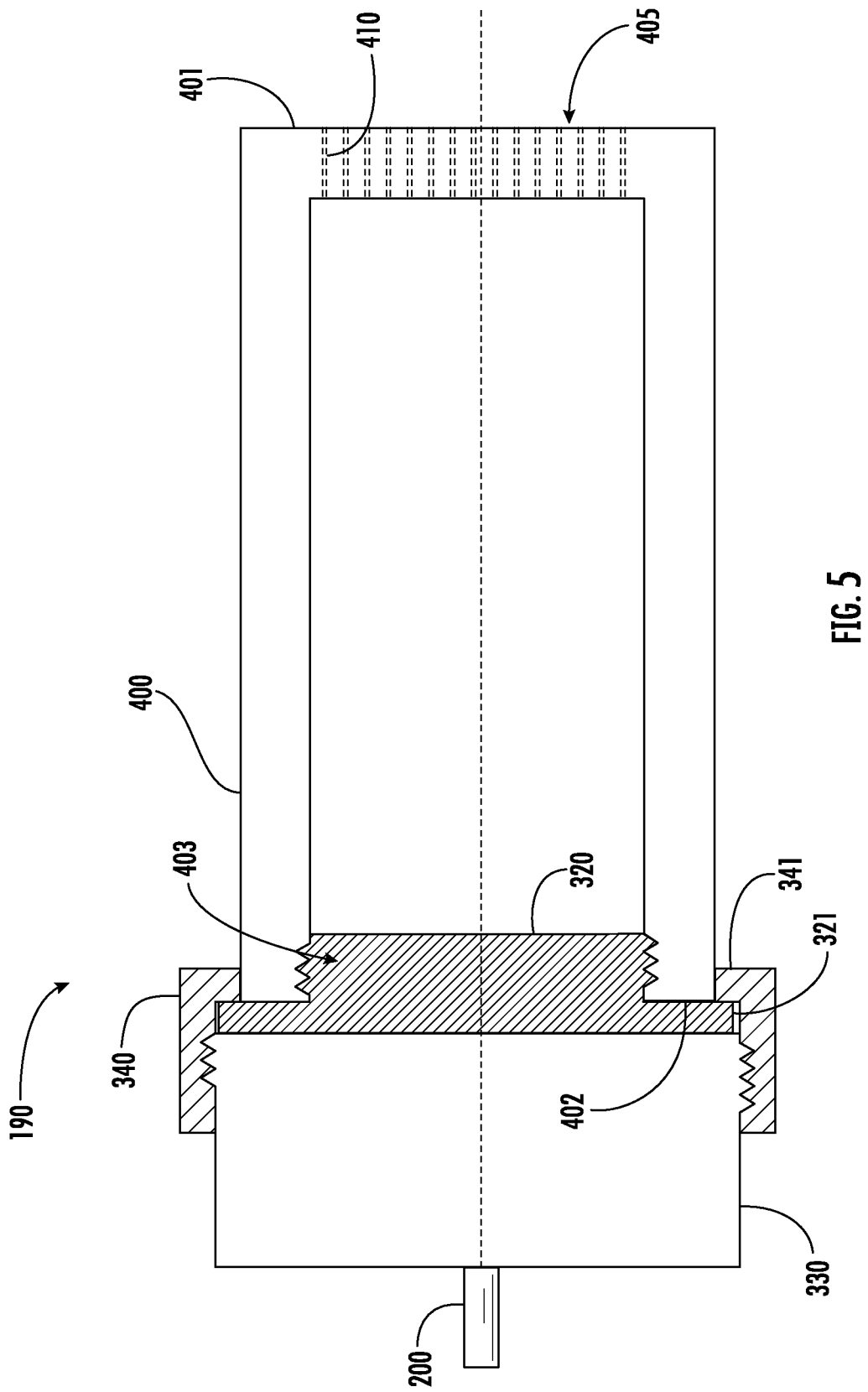
FIG. 5 shows the target holder according to a third embodiment.

For example, FIG. 5 shows a variation of the target holder 190 of FIG. 3, wherein a porous insert 310 is not used. Rather, the crucible 300 of FIG. 3 is replaced with a perforated crucible 400. The perforated crucible 400 may be a hollow cylinder with a closed face 405 on a first end 401 and a hole 403 on the second end 402. The closed face 405 may comprise a plurality of openings 410 that extend through the closed face 405, allowing communication between the interior of the perforated crucible 400 and the exterior of the perforated crucible 400. In other words, the closed face of the perforated crucible 400 serves as the porous surface. The size of the openings 410 may be selected so that the surface tension of the liquid dopant inhibits the passage of liquid through the openings 410 but allows the passage of vapor. The perforated crucible 400 may be constructed of graphite, a refractory material, aluminum oxide, a carbide or another suitable material.

The end plug 320, the target base 330 and the retaining fastener 340 are as described above with respect to FIG. 3.

In this embodiment, the dopant material 195 may be inserted into the target holder 190 as follows. First, the dopant material 195 may be disposed in the perforated crucible 400 through the hole 403 in the second end 402. The presence of the closed face at the first end 401 holds the dopant material 195 in the perforated crucible 400. Once the dopant material 195 has been added, the perforated crucible 400 may be closed by screwing the end plug 320 into the second end 402. The crucible assembly, which includes the perforated crucible 400 and the end plug 320 is then positioned against the target base 330. A retaining fastener 340 is slid over the first end 401 of the perforated crucible 400 and moved toward the second end 402, where it is screwed onto the target base 330. The target holder 190 is now ready for use.

Figure 6:
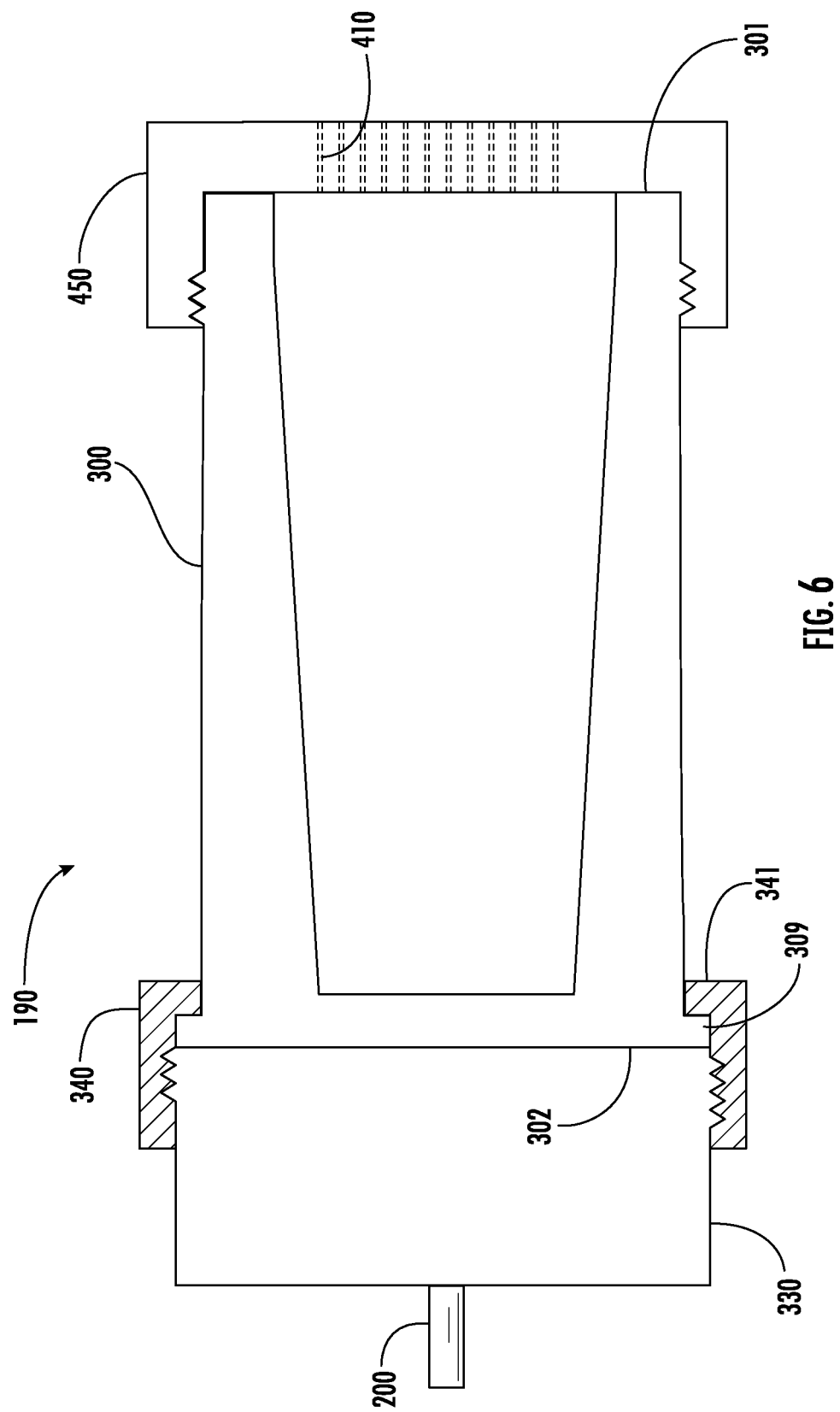
FIG. 6 shows the target holder according to a fourth embodiment.

FIG. 6 shows a variation of the target holder 190 of FIG. 4, wherein a porous insert 310 is not used. Rather, the retention cap 350 of FIG. 4 is replaced with a perforated retention cap 450.

In this embodiment, the perforated retention cap 450 is disposed proximate the first end 301 of the crucible 300. The perforated retention cap 450 is a cylinder with a closed face. The closed face comprises a plurality of openings 410. The inner surface of the cylindrical portion of the perforated retention cap 450 may be threaded. Further, in this embodiment, the outer surface of the crucible 300 near the first end 301 may also be threaded. In this way, the perforated retention cap 450 may be screwed onto the first end 301 of the crucible 300.

Thus, in this embodiment, the first end 301 is both the location where the porous surface is located and where the solid dopant material is added to the crucible 300. Specifically, in this embodiment, the dopant material 195 may be inserted into the target holder 190 as follows. First, the dopant material 195 may be deposited in the crucible 300 through the first end 301. Once the dopant material 195 has been added, the crucible may be closed by screwing the perforated retention cap 450 onto the first end of the crucible 300. The crucible assembly, which includes the crucible 300 and the perforated retention cap 450, is then positioned against the target base 330. A retaining fastener 340 is inserted over the first end 301 of the crucible 300 and slid toward the second end 302, where it is screwed onto the target base 330. The target holder 190 is now ready for use.

By using a perforated retention cap 450, the interior of the crucible can be accessed to replenish the dopant material 195 after the material within the target holder 190 has been consumed. In other words, the crucible 300 may be replenished by optionally removing the crucible assembly from the target base 330 by unscrewing the retaining fastener 340. Once this is done, the perforated retention cap 450 may be unscrewed from the crucible 300. Additional dopant material 195 can then be deposited in the crucible 300.

Further, as shown in FIG. 6, the interior surfaces of the crucible 300 may be sloped or ramped such that the inner diameter of the crucible 300 near the first end 301 is larger than the inner diameter near the second end 302. This allows dopant material to flow toward the first end 301 of the crucible. This may serve to increase the temperature of the dopant material to enhance the creation of vapor near the perforated retention cap 450.

The openings in the perforated retention cap 450 and the perforated crucible 400 may be arranged in a plurality of configurations.

Figure 7:
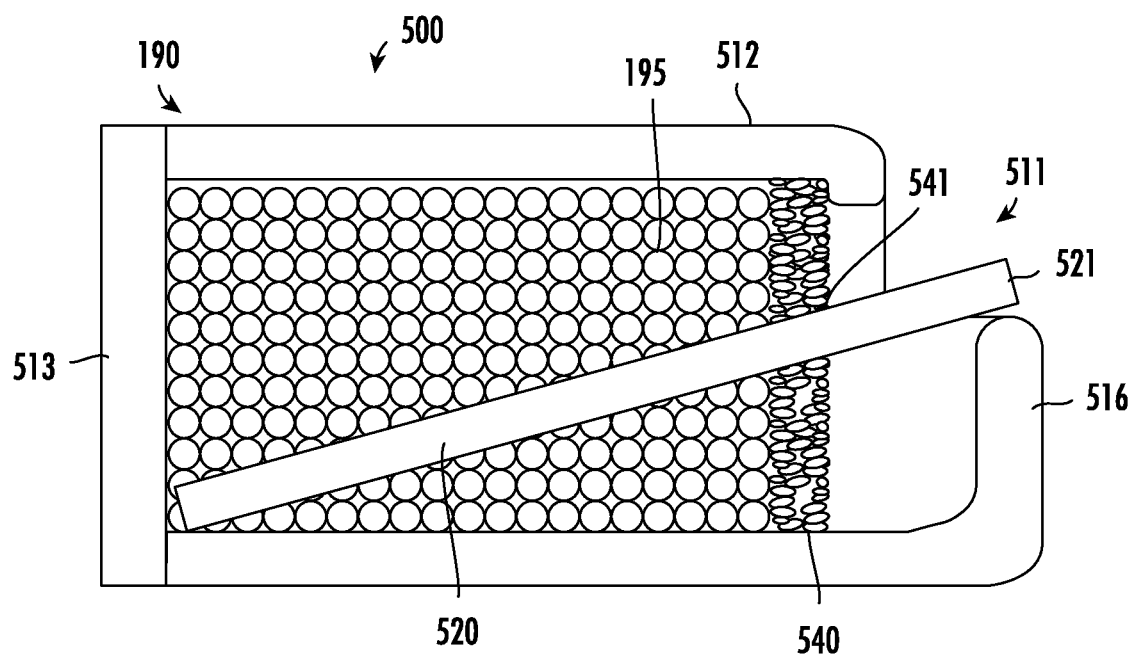
FIG. 7 shows the target holder according to a fifth embodiment.

FIG. 7 shows another embodiment of the target holder 190. A wicking rod 520 is disposed within the cavity 512. In certain embodiments, the wicking rod 520 may be affixed to the back wall 513 of the crucible 500, opposite the front wall 516 containing the crucible aperture 511. It may also be unaffixed in the crucible 500 and held in place by gravity. The wicking rod 520 may be made from graphite, tungsten, or tantalum. Other materials such as carbides and nitrides may also be used. In the embodiment shown in FIG. 7, the wicking rod 520 is a straight solid cylindrical structure. However, in other embodiments, the wicking rod 520 may have a different shape. The length of the wicking rod 520 may be longer than the depth of the cavity 512 such that the tip 521 of the wicking rod 520 may extend beyond the crucible 500 and into the IHC ion source 10. The diameter of the wicking rod 520 may be adjusted based on the application and the desired flow rate of liquid metal. In certain embodiments, larger diameters may result in higher flow rates. The wicking rod 520 may be disposed such that a first end of the wicking rod 520 rests on the floor of the cavity 512 and the wicking rod 520 slopes upward. The tip 521 may be elevated above the first end and extends to or past the crucible aperture 511.

A dopant material 195, such as a metal, is disposed in the cavity 512. In one embodiment, the dopant material 195 is a solid metal, such as aluminum, gallium, lanthanum or indium. In certain embodiments, the dopant material 195 may be a pure metal, where "pure" denotes a metal having a purity of at least 99%. This solid material may be extruded in the form of a wire and wound onto the wicking rod 520. In other embodiments, the solid material may be in the form of beads or a hollow cylinder that is fitted around the wicking rod 520.

A porous material 540 may be included in the cavity 512 to contain the dopant material 195. This porous material 540 may be dimensioned such that it has the same outer dimensions as the inner dimensions of the cavity 512. Further, the porous material 540 may have a hole 541 that passes through it. The porous material 540 may be positioned such that the porous material 540 is disposed between the dopant material 195 and the crucible aperture 511. The wicking rod 520 may pass through the hole 541 in the porous material 540. In this way, the porous material 540 retains the dopant material 195 within the cavity 512, while allowing melted material to flow along the wicking rod 520 toward the tip 521. In another embodiment, the crucible 500 supports the wicking rod 520 at a position closer to the bottom of the crucible 500.

Figure 8:
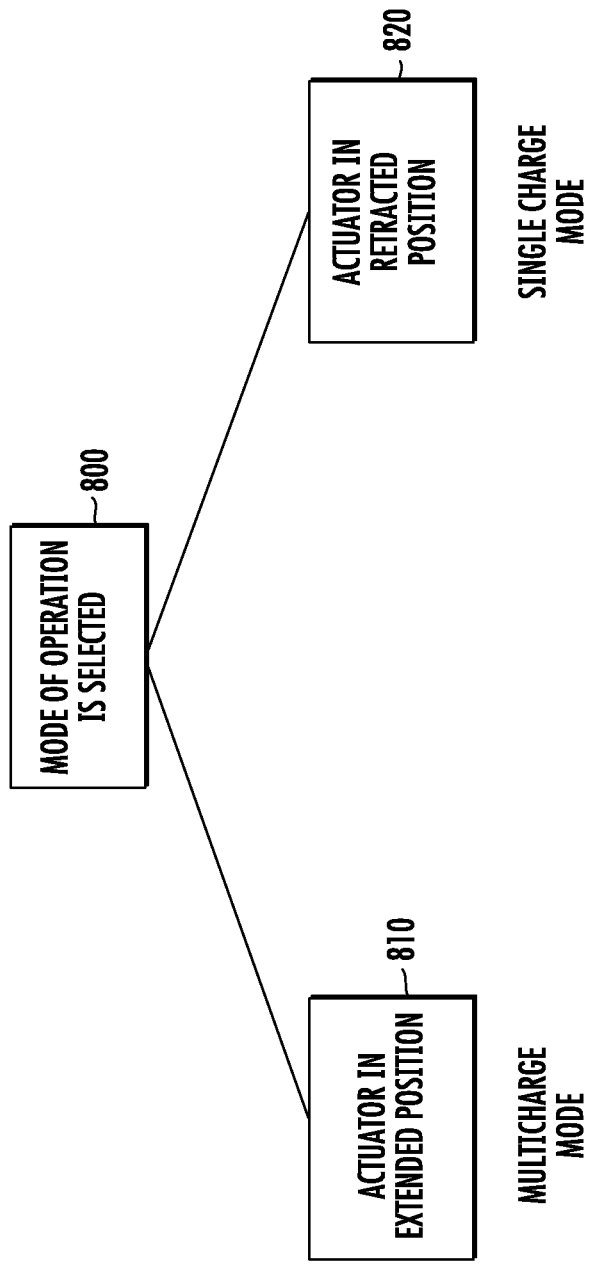
FIG. 8 shows the operation of the controller.

Thus, the present application describes two different modes of operation that may be used to generate different charge states of the desired dopant. Further, by incorporating the target holder 190 and a solid target 175 in the ion source 10, the ion source 10 can easily switch from one mode to another mode with no operator intervention. FIG. 8 shows the operation of the controller 180 to control the modes of the ion source 10. As shown in Box 800, the desired mode of operation is selected, which may depend on the recipe that is being used. This mode may be selected by the operator or user. Alternatively, the controller 180 may automatically select the most appropriate mode based on the desired beam current and charge state. Based on this selection, the controller 180 manipulates the actuator 200, and the valve 171 to achieve the desired mode of operation.

As shown in Box 810, the multicharge mode may be selected, where the majority of metal ions have multiple charges. In response, the controller 180 causes the actuator 200 to move to the extended position such that the target holder 190 is disposed within the arc chamber 100. The controller 180 opens the valve 171 to allow the flow of the gas, which is a halogen containing gas, such as a fluorinated gas, into the arc chamber 100. In this mode, the plasma causes the dopant material 195 to melt and then vaporize. This vaporized dopant material is effective at creating multicharged ions. Additionally, the solid target 175 is etched by the gas and generates additional ions.

Alternatively, as shown in Box 820, the single charge mode may be selected, where the majority of metal ions have a single charge. In response, the controller 180 causes the actuator 200 to move to the retracted position such that the target holder 190 is disposed outside the arc chamber 100. This helps conserve the limited amount of dopant material 195 contained in the target holder 190 to extend overall source life. The controller 180 opens the valve 171 to allow the flow of the gas, which is a halogen containing gas, into the arc chamber 100. In this mode, the plasma causes the gas to ionize and etch the solid target 175, where the majority of the ions that are created are single charged ions.

Thus, to operate in the multicharge mode, the controller 180 configures the ion source 10 such that the plasma ionizes a pure metal, and to operate in the single charge mode, the controller 180 configures the ion source 10 such that the plasma etches and ionizes a solid material which is a compound comprising the metal, which may be a ceramic material.

While the above disclosure describes the use of a ceramic material that contains aluminum as the solid target 175 and aluminum as the dopant material 195, other metals may be used as well. For example, the metal may be gallium. In this embodiment, the solid target 175 may be gallium oxide. In another embodiment, the metal may be indium. In this embodiment, the solid target 175 may be indium oxide. In another embodiment, the metal may be lanthanum. In this embodiment, the solid target 175 may be lanthanum fluoride, lanthanum oxide, or lanthanum hexaboride.

The embodiments described above in the present application may have many advantages. First, the creation of an ion source that can operate in a plurality of modes is advantageous, as the same ion source may be used to create single charged ions and multicharged ions. Additionally, the combination of a crucible and a solid target has additional benefits.

First, the crucible generates a large number of multicharged ions, allowing for high beam currents of multicharged ions. Further, by utilizing a pure metal in the crucible, such as aluminum, impurities in the plasma are minimized. Additionally, by utilizing a halogen containing gas into the multicharge mode, the halogen, such as fluorine, from the first gas also serves to recycle aluminum from the walls of the arc chamber 100. However, the amount of aluminum that can be held in the target holder 190 is limited, so it is best to insert the target holder 190 only when necessary.

Second, the solid target 175 has a long life, such that it does not need to be replaced often. Additionally, when the solid target 175 is etched, it creates mostly single charged ions.

Thus, this ion source is capable of producing single charged or multicharged ions of a selected species, where that species is a metal, such as aluminum, gallium, indium or lanthanum. Additionally, it optimizes the use of the limited material that can be held in the target holder 190.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
   an arc chamber, comprising a plurality of walls and adapted to contain a solid target, wherein the solid target is a compound containing a dopant of interest;
   an indirectly heated cathode disposed in the arc chamber;
   an insertable target holder to hold the dopant of interest;
   an actuator to move the target holder from an extended position within the arc chamber to a retracted position outside the arc chamber;
   a valve in communication with the arc chamber and adapted to connect to a gas source;
   and
   a controller in communication with the actuator and the valve so as to operate the indirectly heated cathode ion source in one of a plurality of modes.

2. The indirectly heated cathode ion source of claim 1, wherein the plurality of modes comprises a single charge mode to create ions of a species having a single charge and a multicharge mode to create ions of the species having two or more charges.

3. The indirectly heated cathode ion source of claim 2, wherein the species comprises a metal.

4. The indirectly heated cathode ion source of claim 2, wherein in the single charge mode, the controller moves the target holder to the retracted position, and opens the valve.

5. The indirectly heated cathode ion source of claim 2, wherein in the multicharge mode, the controller moves the target holder to the extended position, and opens the valve.

6. The indirectly heated cathode ion source of claim 1, further comprising the solid target.

7. The indirectly heated cathode ion source of claim 6, wherein the solid target is mounted on one of the plurality of walls.

8. The indirectly heated cathode ion source of claim 6, wherein the solid target is mounted on an end of the arc chamber opposite the indirectly heated cathode.

9. The indirectly heated cathode ion source of claim 6, wherein the insertable target holder holds a pure metal and the solid target comprises a ceramic material containing the metal.

10. The indirectly heated cathode ion source of claim 9, wherein the metal is aluminum and the ceramic material is aluminum oxide or aluminum nitride.

11. The indirectly heated cathode ion source of claim 1, wherein the gas source contains a halogen containing species.

12. A method of operating an indirectly heated cathode ion source in a plurality of modes, wherein the indirectly heated cathode ion source comprises a controller, an arc chamber and an insertable target holder holding a dopant of interest, and wherein a solid target, which is a compound comprising the dopant of interest, is disposed in the arc chamber, the method comprising:
selecting a desired mode; and
using the controller to configure the indirectly heated cathode ion source to operate in the desired mode,
wherein to operate in a multicharge mode, wherein the multicharge mode is used to create ions of a species having two or more charges, the controller extends the target holder into the arc chamber and enables a flow of a gas into the arc chamber so as to vaporize and ionize the dopant of interest disposed in the target holder; and
wherein to operate in a single charge mode, wherein the single charge mode is to create ions of the species having a single charge, the controller retracts the target holder from the arc chamber and enables the flow of the gas into the arc chamber so that the gas etches the solid target.

13. The method of claim 12, wherein the species comprises a metal.

14. The method of claim 12, wherein the gas comprises a halogen containing species.

15. The method of claim 12, wherein the insertable target holder holds a pure metal and the solid target comprises a ceramic material comprising the metal.

16. The method of claim 15, wherein the metal is aluminum and the ceramic material is aluminum oxide or aluminum nitride.

17. An indirectly heated cathode ion source, comprising:
an arc chamber, comprising a plurality of walls and adapted to contain a solid target;
an indirectly heated cathode disposed in the arc chamber, wherein the indirectly heated cathode is used to generate a plasma in the arc chamber; and
a controller configured to operate the indirectly heated cathode ion source in one of a plurality of modes, wherein in multicharge mode, the controller configures the indirectly heated cathode ion source such that the plasma ionizes a pure metal, and in single charge mode, the controller configures the indirectly heated cathode ion source such that the plasma etches and ionizes the solid target, wherein the solid target is a ceramic material comprising the metal.

18. The indirectly heated cathode ion source of claim 17, wherein the metal is aluminum, and the solid target comprises aluminum oxide or aluminum nitride.

19. The indirectly heated cathode ion source of claim 17, wherein the controller controls an actuator so as to insert and remove the pure metal from the arc chamber.

\* \* \* \* \*